United States Patent [19]

Weitzel et al.

[11] 4,160,260
[45] Jul. 3, 1979

[54] PLANAR SEMICONDUCTOR DEVICES AND METHOD OF MAKING THE SAME

[75] Inventors: Charles E. Weitzel, Plainsboro; Joseph H. Scott, Princeton, both of N.J.

[73] Assignee: RCA Corp., New York, N.Y.

[21] Appl. No.: 852,565

[22] Filed: Nov. 17, 1977

[51] Int. Cl.² .......................................... H01L 29/78
[52] U.S. Cl. ...................................... 357/23; 357/4; 357/52; 357/55; 357/59
[58] Field of Search ................... 357/4, 23, 59, 52, 55

[56] References Cited
U.S. PATENT DOCUMENTS

| 3,936,859 | 2/1976 | Dingwall | 357/59 |
| 4,048,649 | 9/1977 | Bohn | 357/59 |

*Primary Examiner*—Edward J. Wojciechowicz
*Attorney, Agent, or Firm*—H. Christoffersen; D. S. Cohen; L. P. Benjamin

[57] ABSTRACT

A semiconductor device includes a region of polycrystalline silicon on a portion of the surface of a body of semiconductor material. A layer of oxidized polycrystalline silicon is also on the semiconductor material body and extends to the polycrystalline silicon region. The surface of the silicon oxide layer is substantially coplanar with the surface of the polycrystalline silicon region so that a metal film conductor can be easily provided over the semiconductor device. The polycrystalline silicon region may be the gate of an MOS transistor or a conductive region of any type of semiconductor device. The semiconductor device is made by forming a polycrystalline silicon layer over the semiconductor material body, forming a mask on a portion of the polycrystalline silicon layer, reducing the thickness of the unmasked portion of the polycrystalline silicon layer and then oxidizing the unmasked portion of the polycrystalline silicon layer to form the oxide layer.

3 Claims, 4 Drawing Figures

PLANAR SEMICONDUCTOR DEVICES AND METHOD OF MAKING THE SAME

BACKGROUND OF THE INVENTION

The present invention relates to a semiconductor device having a substantially planar surface and particularly to such a semiconductor device which includes at least one region of polycrystalline silicon on a body of semiconductor material.

In many semiconductor devices, particularly integrated circuit devices, it is desirable that the device have a planar surface over which extends the metallization forming contacts to portions of the device and interconnections between the contacts. This planar surface is desirable so that the metallization does not have to extend over edges which can cause breaks in the metallization. Also, it is easier to define a metallization pattern which is substantially planar.

This problem of providing a planar surface is most apparent in silicon-on-sapphire (SOS semiconductor devices which include a plurality of individual bodies or islands of semiconductor material in spaced relation on a substrate of insulating material, such as sapphire. The spaced bodies of the semiconductor material form ridges over which the metallization must be extended. However, various techniques have been developed to fill in the spaces between the spaced bodies of the semiconductor material with an insulating material so as to provide a planar surface over which the semiconductor surface can extend.

A type of semiconductor device often used in integrated circuit devices and particularly SOS integrated circuit devices is the MOS transistor which includes a gate over the semiconductor material body. One type of gate used is made of polycrystalline silicon which is relatively thick and thus provides a ridge over which metallization must extend. Therefore it would be desirable to have such a semiconductor device which includes a polycrystalline silicon gate with a substantially planar surface over which the metallization can extend.

SUMMARY OF THE INVENTION

A semiconductor device includes a body of semiconductor material having a region of polycrystalline silicon over a portion of the semiconductor body. A layer of oxidized polycrystalline silicon is over the semiconductor body and extends up to and contacts the polycrystalline silicon region. The surface of the oxidized polycrystalline silicon layer is substantially coplanar with the surface of the polycrystalline silicon region. The device is made by depositing a layer of polycrystalline silicon over the semiconductor body, forming a mask over a portion of the polycrystalline silicon layer, reducing the thickness of the unmasked portion of the polycrystalline silicon layer and oxidizing the unmasked portion of the polycrystalline silicon layer to form the silicon oxide layer.

Figure 1:
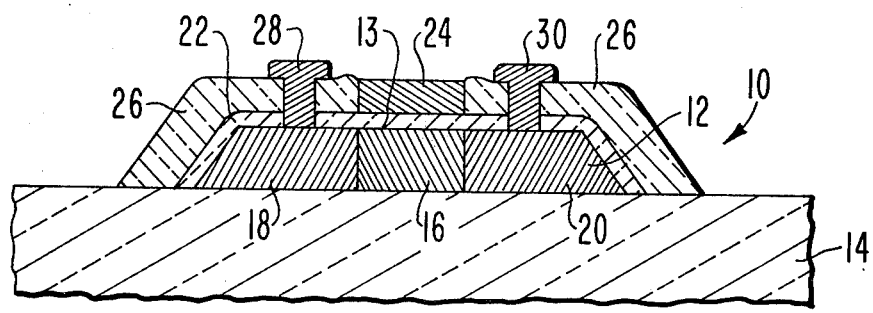
FIG. 1 is a sectional view of an MOS transistor made in accordance with the present invention.

Referring initially to FIG. 1, one form of MOS transistor made in accordance with the present invention is generally designated as 10. The MOS transistor 10 comprises a body 12 of a semiconductor material, such as single crystalline silicon, on a substrate 14 of insulating material, such as sapphire. The semiconductor body 12 has a planar surface 13 includes a middle portion 16 of one conductivity type which serve as the channel of the serves and end portions 18 and 20 of the opposite conductivity type which serve as the source and drain regions of the transistor. A thin layer 22 of an oxide, such as silicon oxide is on and covers the planar surface 13 of the semiconductor body 12. The portion of the silicon oxide layer 22 which extends over the channel region 16 serves as the channel oxide of the transistor 10. A region 24 of polycrystalline silicon is on the silicon oxide layer 22 and extends over the channel region 16 of the semiconductor body 12. The polycrystalline silicon region 24 serves as the gate of the transistor and may include a conductivity modifier to increase the conductivity of the region. Also, the polycrystalline silicon region 24 is relatively thick, typically around 5000Å as compared to the channel oxide layer 22, which is typically about 1000Å. A layer 26 of oxidized polycrystalline silicon is on the remaining portion of the channel oxide layer 22 and extends up to and contacts the polycrystalline silicon region 24. The surface of the oxidized polycrystalline silicon layer 26 is substantially coplanar with the surface of the polycrystalline silicon region 24 so as to provide a planar surface over which metallization can extend. Metal contacts 28 and 30 extend through openings in the oxidized polycrystalline silicon layer 26 and the silicon oxide layer 22 to contact the source and drain regions 18 and 20, respectively.

To make the MOS transistor 10, a body 12 of the semiconductor material is first formed on the substrate 14 in a manner well known in the art of making a silicon-on-sapphire device. The semiconductor material body 12 is generally a portion of a layer of the semiconductor material epitaxially grown on the substrate 14. The semiconductor body 12 is initially of the conductivity type desired for the channel region 16. The silicon oxide layer 22 is then formed, such as by heating the semiconductor material body 12 in an oxidizing ambient to a temperature of about 1000° C. for a time long enough to grow the silicon oxide layer to the desired thickness, which is about 1000Å.

Figure 2:
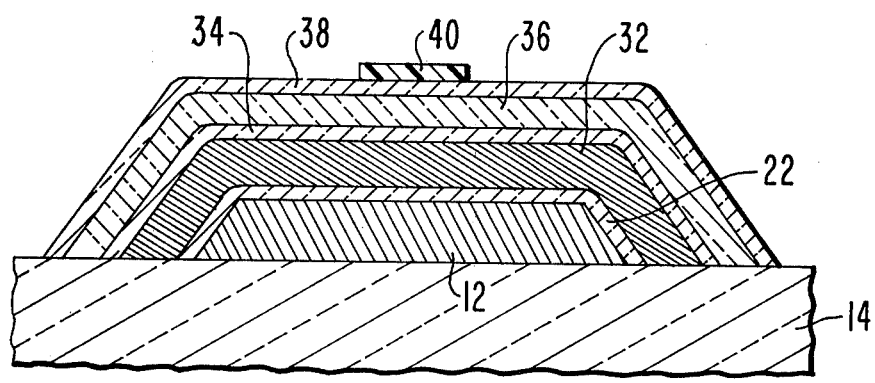
FIGS. 2-4 are sectional views illustrating the various steps of making the transistor shown in FIG. 1.

Next a layer 32 of polycrystalline silicon is deposited over the silicon oxide layer 22 as shown in FIG. 2. The polycrystalline silicon layer may be deposited by pyrolytically decomposing a material containing silicon, such as silane (SiH$_4$). Next, a very thin layer 34, approximately 100-200A in thickness of silicon oxide is formed over the polycrystalline silicon layer 32. This may be formed by either heating the polycrystalline silicon layer 32 in an oxidizing atmosphere or by pyrolytically decomposing a material containing silicon in an oxygen ambient.

A masking layer 36 of silicon nitride is then deposited over the silicon oxide layer 34. This can be accomplished by pyrolytically decomposing silane and ammonia at a temperature of about 750° C. The silicon nitride layer 36 is typically of a thickness of between 500 and 2000Å. A layer 38 of silicon oxide is then provided over the silicon nitride layer 36. The silicon oxide layer 38 may be formed by pyrolytically decomposing a material containing silicon, such as silane, in an oxidizing ambient. The silicon oxide layer 38 may be of a thickness of about 500Å. A layer 40 of photoresist material is then provided on the silicon oxide layer 38 over the region of the semiconductor body 12 which is to form the channel region 16. The photoresist layer 40 is formed by standard photolithographic techniques.

Figure 3:
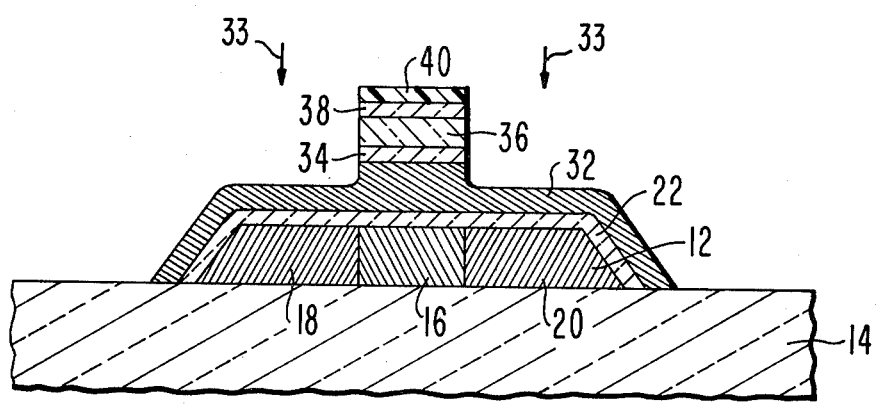
Figure 4:
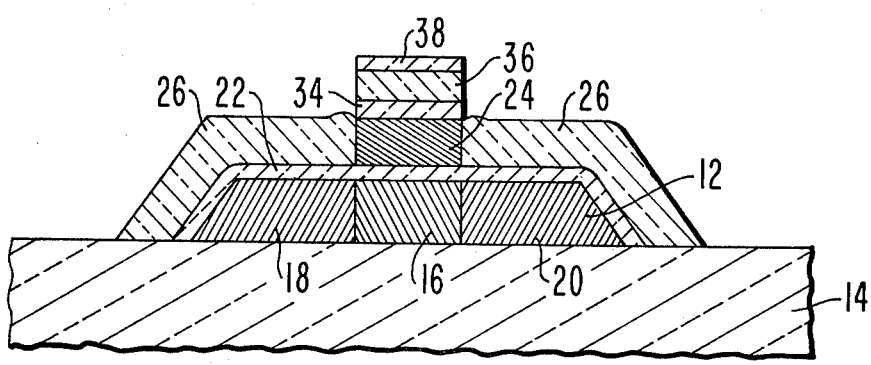

As shown in FIG. 3, the unmasked portion of the silicon oxide layer 38 is first removed, such as by etching with buffered hydrofluoric acid, to expose the silicon nitride layer 36 which is then removed, such as by etching with phosphoric acid. This exposes the silicon oxide layer 34 which is then removed with buffered hydrofluoric acid to expose the polycrystalline silicon layer 32. The exposed portions of polycrystalline silicon layer 32 are then reduced in thickness, such as by etching with potassium hydroxide at 75° C. The exposed portions of the polycrystalline silicon layer 32 are reduced in thickness by about one-half. Instead of using various etchants to remove the exposed portions of various layers, they can be removed by plasma etching if desired.

The source and drain regions 18 and 20 of the transistors are then formed by ion implanting conductivity modifiers into the semiconductor body 12 through the thinned portions of the polycrystalline silicon layer 32 as indicated by the arrows 33 in FIG. 3. With a polycrystalline silicon layer 32 thinned down to about 2500–3000Å and a channel oxide layer of about 1000Å, phosphorus ions for inducing N type conductivity, can be implanted into the semiconductor body 12 at 300 KeV and a dosage of $2 \times 10^{15}$ ions/square centimeter. Boron ions for inducing P type conductivity can be implanted at 110 KeV at a dosage of $2 \times 10^{15}$ ions/square centimeter.

The device is then heated in an oxygen ambient at a temperature of about 950° C. to oxidize the thinned down portion of the polycrystalline silicon layer 32 which is not covered by the various masking layers. As the polycrystalline silicon layer is oxidized it increases in thickness. It is known that when a layer of silicon is oxidized it will about double in thickness. Thus, when the thinned down portion of the polycrystalline silicon layer is completely oxidized it will have a thickness substantially equal to the thickness of the masked portion of the polycrystalline silicon layer which is not oxidized. Thus when the thinned down portion of the polycrystalline silicon layer 32 is completely oxidized, there will be provided the polycrystalline silicon region 24 over the channel region 16 and the oxidized polycrystalline silicon layer 26 on each side of the polycrystalline silicon region 24, with the surface of the oxidized polycrystalline silicon layer 26 being substantially coplanar with the surface of the polycrystalline silicon region 24.

The masking layer 38 of silicon oxide, the silicon nitride layer 36 and the silicon oxide layer 34 can then be removed with suitable etchants. Finally, openings can be formed in the oxidized polycrystalline silicon layer 20 and the channel oxide layer 22 and the metal contacts 28 and 30 (FIG. 1) formed in such openings. When the masking silicon oxide layers 38 and 34 are removed, the etchant may also remove some of the oxidized polycrystalline silicon layer 26. Therefore, it is preferable to form the oxidized polycrystalline silicon layer slighty thicker than the polycrystalline silicon region 24 so that after the masking oxide layers are removed the surface of the oxidized polycrystalline silicon layer 26 will be coplanar with the surface of the polycrystalline silicon region 24.

Thus there is provided a semiconductor device, particularly a MOS transistor, having a relatively thick region of polycrystalline silicon, with the surface of the device being made planar by an oxidized polycrystalline silicon layer extending up to the polycrystalline silicon region and having a surface which is substantially coplanar with the surface of the polycrystalline silicon region. Although the present invention has been described with regard to making a single MOS transistor, it can also be used in an integrated circuit having a plurality of spaced bodies of semiconductor material on an insulating substrate with a separate MOS transistor in each body. Also, although the present invention has been described with regard to an MOS transistor made in a silicon body on an insulating substrate (silicon-on-sapphire), the invention can also be used for an MOS device or devices in a bulk body of semiconductor material.

What is claimed is:

1. A semiconductor device comprising:
   a body of semiconductor material having a planar surface thereon and spaced drain and source portions embedded therein at the surface, the drain and source portions spaced one from the other defining a channel portion therebetween;
   a region of polycrystalline silicon disposed over the channel portion of the semiconductor body; and
   a layer of oxidized polycrystalline silicon disposed over the drain and source portions of the semiconductor body, the oxidized polycrystalline silicon layer extending up to and contacting the polycrystalline silicon region, with the surface of the oxidized polycrystalline silicon layer being substantially coplanar with the surface of the polycrystalline silicon region.

2. A semiconductor device in accordance with claim 1 in which at least a portion of the surface of the semiconductor body is planar and the polycrystalline silicon region and at least portions of the surface of the oxidized polycrystalline silicon layer adjacent the polycrystalline silicon region are over the planar surface of the semiconductor body.

3. A semiconductor device in accordance with claim 2 including a layer of silicon oxide between the polycrystalline silicon region and the surface of the semiconductor body, and wherein the semiconductor body is of one conductivity type in the region directly under the polycrystalline silicon region and is of the opposite conductivity type at each side of the polycrystalline silicon region.

* * * * *

UNITED STATES PATENT AND TRADEMARK OFFICE
CERTIFICATE OF CORRECTION

PATENT NO. : 4,160,260

DATED : July 3, 1979

INVENTOR(S) : Charles E. Weitzel and Joseph H. Scott

It is certified that error appears in the above-identified patent and that said Letters Patent is hereby corrected as shown below:

Column 2, line 4, "serve" should be --serves--.

Column 2, line 5, "serves" should be --transistor,--.

Signed and Sealed this

Ninth Day of October 1979

[SEAL]

Attest:

RUTH C. MASON
Attesting Officer

LUTRELLE F. PARKER
Acting Commissioner of Patents and Trademarks